(12) United States Patent
Song

(10) Patent No.: US 9,620,046 B2
(45) Date of Patent: Apr. 11, 2017

(54) ORGANIC LIGHT-EMITTING DISPLAY DEVICE AND METHOD OF DETECTING DEFECT IN THE ORGANIC LIGHT-EMITTING DISPLAY DEVICE

(71) Applicant: Samsung Display Co. Ltd., Yongin (KR)

(72) Inventor: Bong Sub Song, Cheonan-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 251 days.

(21) Appl. No.: 14/466,629

(22) Filed: Aug. 22, 2014

(65) Prior Publication Data

US 2015/0054542 A1    Feb. 26, 2015

(30) Foreign Application Priority Data

Aug. 23, 2013 (KR) ..................... 10-2013-0100445

(51) Int. Cl.
| | |
|---|---|
| G09G 3/00 | (2006.01) |
| G01R 31/44 | (2006.01) |
| H01L 27/32 | (2006.01) |
| G01R 31/26 | (2014.01) |
| G09G 3/3233 | (2016.01) |

(52) U.S. Cl.
CPC ........... *G09G 3/006* (2013.01); *G09G 3/3233* (2013.01); *G01R 31/2642* (2013.01); *G09G 2300/0842* (2013.01); *G09G 2330/10* (2013.01)

(58) Field of Classification Search
CPC ..................... G09G 3/006; G09G 3/22; G09G 3/30–3/3291; H05B 33/10
See application file for complete search history.

(56) References Cited

U.S. PATENT DOCUMENTS

| | | | | |
|---|---|---|---|---|
| 2007/0008538 | A1* | 1/2007 | Kiraly | G01N 21/8903 356/430 |
| 2007/0040548 | A1* | 2/2007 | Sakaguchi | G09G 3/006 324/762.07 |
| 2007/0210998 | A1* | 9/2007 | Chiou | G09G 3/325 345/82 |

(Continued)

FOREIGN PATENT DOCUMENTS

| | | |
|---|---|---|
| KR | 1020020046018 A | 6/2002 |
| KR | 1020100008840 A | 1/2010 |
| KR | 1020110123983 A | 11/2011 |

*Primary Examiner* — Huy Q Phan
*Assistant Examiner* — David Frederiksen
(74) *Attorney, Agent, or Firm* — Cantor Colburn LLP

(57) ABSTRACT

A method of detecting a defect in an organic light-emitting display device includes: preparing an organic light-emitting display device including an organic light-emitting display panel which includes a plurality of pixels, where each of the pixels includes a driving transistor which operates in a saturation region or a transition region based on a potential difference between a source and a drain thereof and outputs a driving current, and an organic light-emitting diode which emits light based on the driving current; providing a plurality of voltages to the organic light-emitting display panel to operate the driving transistor in the transition region, and determining whether the organic light-emitting display device is defective based on an image, which is displayed on the organic light-emitting display panel based on data applied thereto.

14 Claims, 8 Drawing Sheets

(56) References Cited

U.S. PATENT DOCUMENTS

| | | | |
|---|---|---|---|
| 2008/0057818 A1* | 3/2008 | Ogawa | H05B 33/10 445/3 |
| 2008/0238911 A1* | 10/2008 | Chung | G09G 3/2055 345/214 |
| 2011/0063331 A1* | 3/2011 | Karrenbauer | G09G 3/3426 345/690 |
| 2012/0249779 A1* | 10/2012 | Ji | G01N 21/8806 348/131 |
| 2013/0155033 A1* | 6/2013 | Jin | G09G 3/3266 345/204 |
| 2014/0055444 A1* | 2/2014 | Jang | G09G 3/3291 345/213 |

* cited by examiner

FIG. 6

| | | | Rf | | | | |
|---|---|---|---|---|---|---|---|
| 82 | 84 | 83 | 79 | 81 | 80 | 79 | 82 |
| 81 | 79 | 79 | PX2 75 | 75 | 81 | 83 | 80 |
| 80 | 78 | 76 | 63 | 60 | 68 | 77 | 81 |
| 82 | PX4 77 | 60 | PX1 51 | 45 | PX5 52 | 69 | 79 |
| 80 | 81 | 79 | 59 | 54 | 70 | 70 | 78 |
| 82 | 78 | 80 | PX3 77 | 72 | 75 | 80 | 82 |
| 81 | 83 | 77 | 81 | 80 | 78 | 80 | 79 |

ORGANIC LIGHT-EMITTING DISPLAY DEVICE AND METHOD OF DETECTING DEFECT IN THE ORGANIC LIGHT-EMITTING DISPLAY DEVICE

This application claims priority to Korean Patent Application No. 10-2013-0100445, filed on Aug. 23, 2013, and all the benefits accruing therefrom under 35 U.S.C. §119, the content of which in its entirety is herein incorporated by reference.

BACKGROUND

1. Field

Exemplary embodiments of the invention relate to an organic light-emitting display device and a method of detecting a defect in the organic light-emitting display device, and more particularly, to an organic light-emitting display device and a method of easily detecting a dark spot defect in the organic light-emitting display device.

2. Description of the Related Art

As portable display devices, such as notebooks, mobile phones and portable media players ("PMP"s) as well as fixed display devices, such as televisions ("TV"s) and monitors, become lighter and thinner, various flat panel display devices are being widely used for such devices. A flat panel display device includes a display panel for displaying an image and may be classified into a liquid crystal display device, an organic light-emitting display device, an electrophoretic display device, etc. based on the type of the display panel.

An organic light-emitting display device may include a plurality of pixels, and each of the pixels may include an anode, a cathode, and an organic light-emitting layer interposed between the anode and the cathode. The organic light-emitting layer may emit light at a luminance level corresponding to an electric current flowing between the anode and the cathode. The organic light-emitting display device may display a desired image by controlling the electric current flowing between the anode and the cathode.

When an organic light-emitting display panel is manufactured, impurities (such as moisture or oxygen) that penetrate into the organic light-emitting display panel may oxidize or contaminate an organic light-emitting layer, thereby degrading the performance of an organic light-emitting diode. Furthermore, outgassing from an organic insulating layer included in the organic light-emitting display panel may contaminate the organic light-emitting layer, thereby degrading the performance of the organic light-emitting diode. Organic light-emitting diodes located in a region having impurities or outgassing may be degraded. Thus, the emission luminance of the organic light-emitting diodes located in the region having impurities or outgassing may be lower than the emission luminance of normal organic light-emitting diodes such that dark spots may occur on the organic light-emitting display panel and cause defects in the organic light-emitting display device.

The degradation of an organic light-emitting diode due to impurities or outgassing may gradually develop over time. Therefore, a dark spot may not be visible immediately after the production of a product and may become clearly visible over time. Thus, a dark spot defect undetected immediately after the production of the product may be detected after the passage of time.

SUMMARY

Exemplary embodiments of the invention provide a method of detecting a dark spot defect in an organic light-emitting display device.

Exemplary embodiments of the invention also provide an organic light-emitting display device in which a dark spot defect is effectively and efficiently detected.

According to an exemplary embodiment of the invention, a method of detecting a defect in an organic light-emitting display device includes: preparing an organic light-emitting display device including an organic light-emitting display panel which includes a plurality of pixels, where each of the pixels includes a driving transistor which operates in a saturation region or a transition region based on a potential difference between a source and a drain thereof and outputs a driving current, and an organic light-emitting diode which emits light based on the driving current; providing a plurality of voltages to the organic light-emitting display panel to operate the driving transistor in the transition region, and determining whether the organic light-emitting display device is defective based on an image, which is displayed on the organic light-emitting display panel based on data applied thereto.

According to another exemplary embodiments of the invention, an organic light-emitting display device includes an organic light-emitting display panel comprising a plurality of pixels, where each of the pixels includes a driving transistor which operates in a saturation region or a transition region based on a potential difference between a source and a drain thereof and outputs a driving current, and an organic light-emitting diode which emits light based on the driving current. In such an embodiment, the organic light-emitting display panel operates in a normal mode or a defect determination mode, and the driving transistor operates in the saturation region when the organic light-emitting display panel operates in the normal mode, and operates in the transition region when the organic light-emitting display panel operates in the defect determination mode.

BRIEF DESCRIPTION OF THE DRAWINGS

The above and other features of the invention will become more apparent by describing in detail exemplary embodiments thereof with reference to the attached drawings, in which:

FIG. 6 is a diagram illustrating gray values of a plurality of pixels an exemplary embodiment of an organic light-emitting display device, according to the invention;

DETAILED DESCRIPTION

Figure 1:
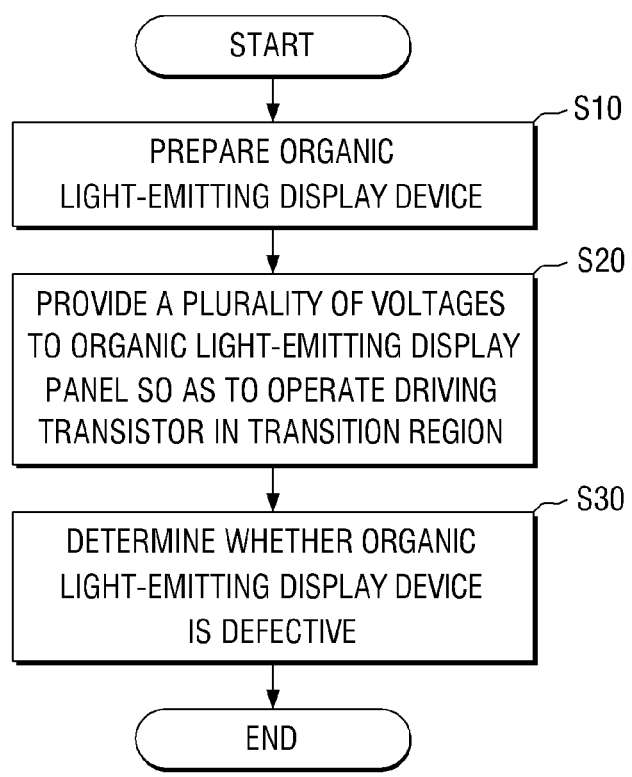
FIG. 1 is a flowchart illustrating an exemplary embodiment of a method of detecting a defect in an organic light-emitting display device, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described with reference to the accompanying drawings.

FIG. 1 is a flowchart illustrating an exemplary embodiment of a method of detecting a defect in an organic light-emitting display device, according to the invention. Referring to FIG. 1, an exemplary embodiment of the method of detecting a defect in an organic light-emitting display device includes preparing an organic light-emitting display device (operation S10), providing a plurality of voltages to an organic light-emitting display panel to operate a driving transistor in a transition region (operation S20), and determining whether the organic light-emitting display device is defective (operation S30).

Figure 2:
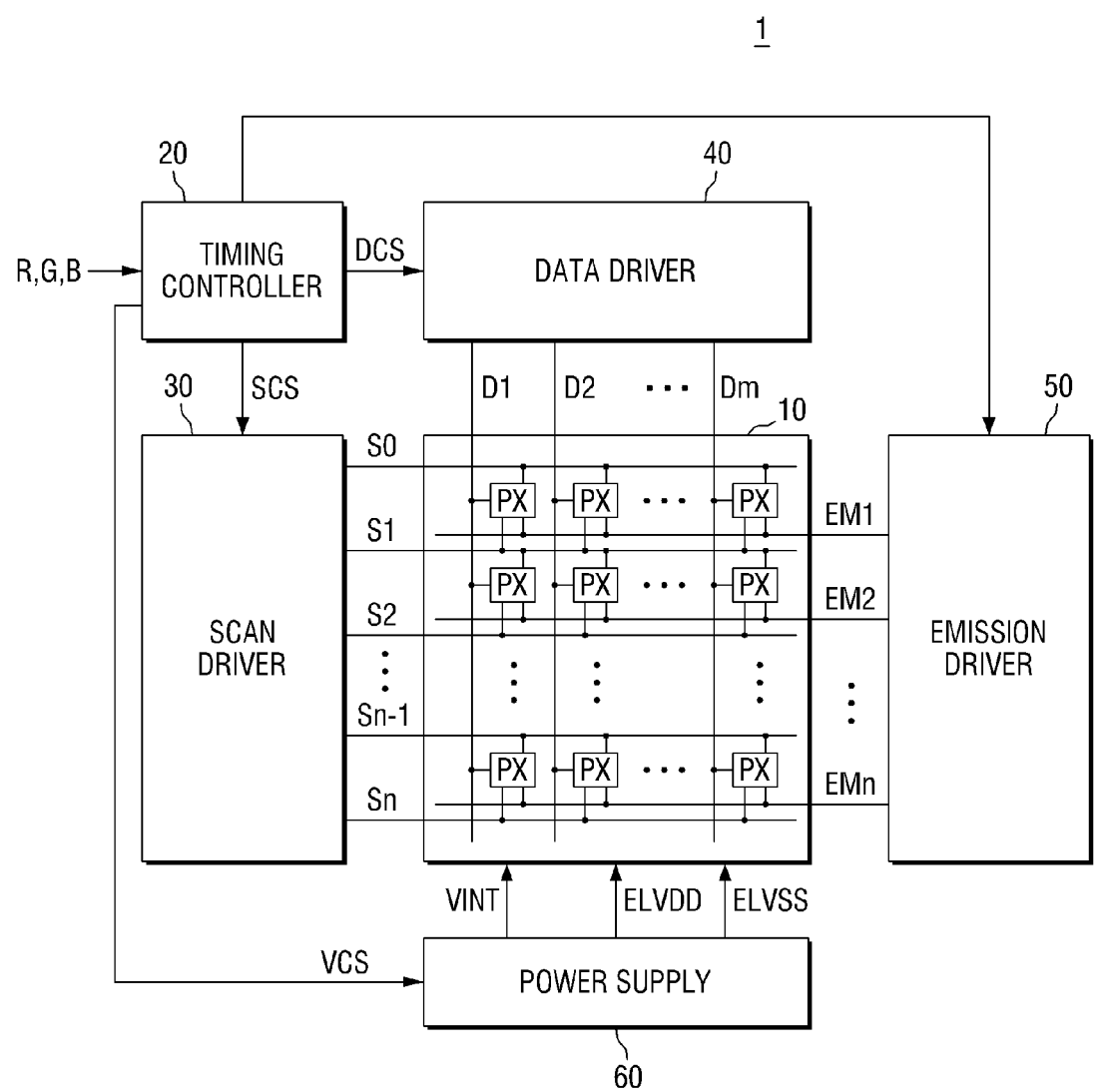
FIG. 2 is a block diagram showing an exemplary embodiment of an organic light-emitting display device, according to the invention.

An organic light-emitting display device prepared in the preparing of the organic light-emitting display device (operation S10) will now be described in detail with reference to FIG. 2. FIG. 2 is a block diagram showing an exemplary embodiment of an organic light-emitting display device 1, according to the invention.

Referring to FIG. 2, the organic light-emitting display device 1 includes an organic light-emitting display panel 10. The organic light-emitting display panel 10 may display an image corresponding to zeroth through $n^{th}$ scan signals S0 through Sn transmitted from a scan driver 30 and first through $m^{th}$ data signals D1 through Dm transmitted from a data driver 40. The organic light-emitting display panel 10 includes a plurality of pixels PX. The pixels PX may be arranged substantially in a matrix form. The pixels PX may emit light at luminance levels corresponding to the zeroth through $n^{th}$ scan signals S0 through Sn and the first through $m^{th}$ data signals D1 through Dm, thereby displaying an image on the organic light-emitting display panel 10.

Figure 3:
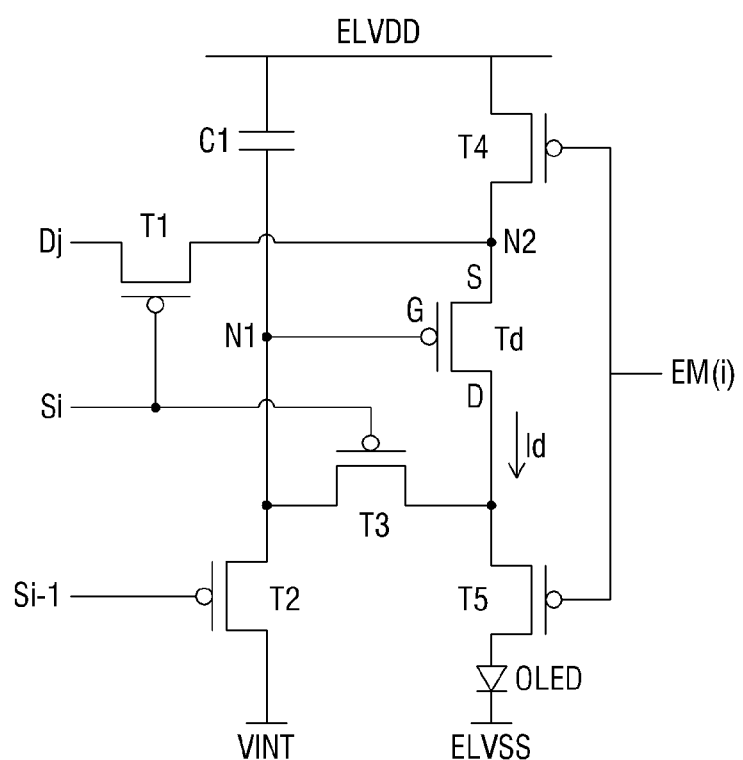
FIG. 3 is a circuit diagram showing a pixel of an exemplary embodiment of an organic light-emitting display device, according to the invention.

The pixels PX will now be described in greater detail with reference to FIG. 3. FIG. 3 is a circuit diagram of a pixel PX of an exemplary embodiment of an organic light-emitting display device according to the invention.

Referring to FIG. 3, the pixel PX includes a driving transistor Td and an organic light-emitting diode OLED. The driving transistor Td may include a gate G connected to a first node N1, a source S connected to a second node N2, and a drain D connected to a third node N3. The driving transistor Td may control a driving current Id. The driving current Id may be an electric current flowing from the source S to the drain D of the driving transistor Td. The driving current Id may be an electric current flowing to the organic light-emitting diode OLED, and the organic light-emitting diode OLED may emit light at a luminance level corresponding to the driving current Id. The magnitude of the driving current Id may correspond to a potential difference between the gate G and the source S of the driving transistor Td and a potential difference between the drain D and the source S of the driving transistor Td. As the potential difference between the gate G and the source S increases, the driving current Id may increase, and as the potential difference between the drain D and the source S increase, the driving current Id may increase. When the potential difference between the gate G and the source S is maintained constant, the driving current Id may be controlled based on the potential difference between the drain D and the source S.

Figure 4:
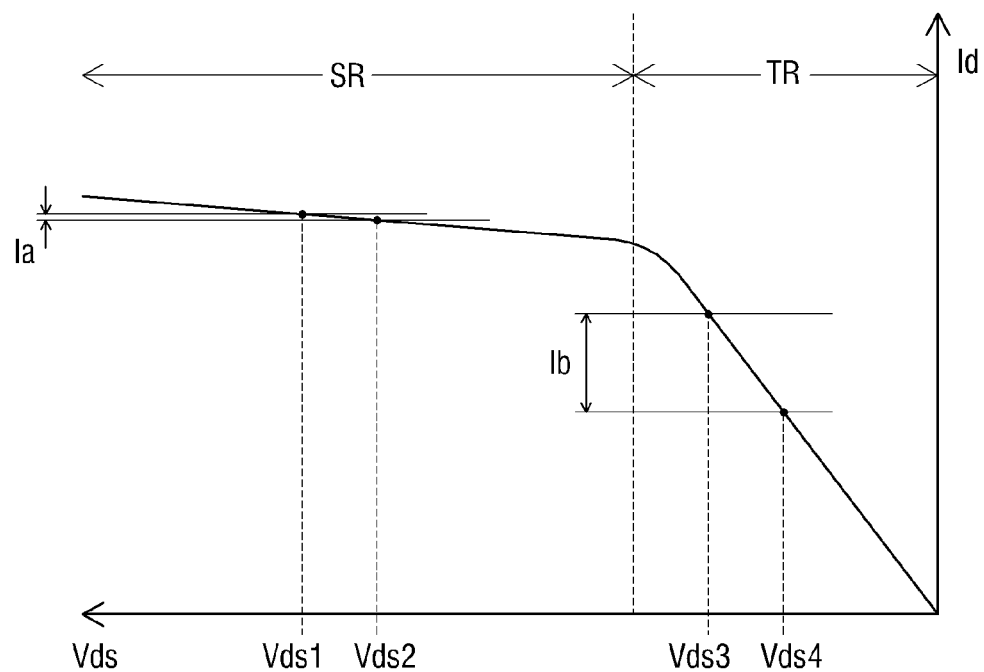
FIG. 4 is a graph illustrating the relationship between a potential difference between a drain and a source of a driving transistor and a driving current in an exemplary embodiment of an organic light-emitting display device, according to the invention.

The relationship between a potential difference Vds between the drain D and the source S and the driving current Id will now be described in greater detail with reference to FIG. 4. FIG. 4 is a graph illustrating the relationship between the potential difference Vds between the drain D and the source S of the driving transistor Td and the driving current Id in an exemplary embodiment of an organic light-emitting display device according to the invention.

Referring to FIG. 4, the potential difference Vds between the drain D and the source S may be a value obtained by subtracting a voltage of the source S from a voltage of the drain D. The driving current Id may increase as the absolute value of the potential difference Vds between the drain D and the source S increases. The driving transistor Td may operate in a saturation region SR or a transition region TR according to a change in the driving current Id which corresponds to a change in the potential difference Vds between the drain D and the source S. The potential difference Vds between the drain D and the source S may be greater in the saturation region SR than in the transition region TR. The change in the driving current Id which corresponds to the change in the potential difference Vds between the drain D and the source S may be less in the saturation region SR than in the transition region TR. In one exemplary embodiment, for example, when the potential difference Vds between the drain D and the source S changes from a first voltage Vds1 to a second voltage Vds2 in the saturation region SR, the driving current Id may be changed by a first current Ia. When the potential difference Vds between the drain D and the source S changes from a third voltage Vds3 to a fourth voltage Vds4 in the transition region TR, the driving current Id may be changed by a second current Ib which is greater than the first current Ia. Here, a difference between the first voltage Vds1 and the second voltage Vds2 is equal to a difference between the third voltage Vds3 and the fourth voltage Vds4. In such an embodiment, where the change in the driving current Id according to the change in the potential difference Vds between the drain D and the source S is greater in the transition region TR than in the saturation region SR, a change in the luminance of the organic light-emitting diode OLED is also greater in the transition region TR than in the saturation region SR.

Referring back to FIG. 3, an anode of the organic light-emitting diode OLED may be connected to the drain D of the driving transistor Td. The organic light-emitting diode OLED may emit light at a luminance level corresponding to the driving current Id. In such an embodiment, when the driving current Id increases, the emission luminance of the organic light-emitting diode OLED may also increase accordingly. The organic light-emitting diode OLED may include a cathode, the anode, and an organic light-emitting layer interposed between the cathode and the anode. In such an embodiment, external moisture or gas that penetrates into the organic light-emitting display panel 10 may oxidize or deform the organic light-emitting layer, thereby degrading the performance of the organic light-emitting layer. In such an embodiment, outgassing generated within the organic light-emitting display panel 10 may oxidize or deform the organic light-emitting layer, thereby degrading the performance of the organic light-emitting layer. The degradation of the performance of the organic light-emitting layer may increase internal resistance of the organic light-emitting layer, and the increased internal resistance of the organic light-emitting layer may reduce the potential difference Vds between the drain D and the source S of the driving transistor Td. In such an embodiment, an electric potential of the anode of the organic light-emitting diode OLED having the degraded organic light-emitting layer may be greater than an electric potential of an anode of an organic light-emitting diode OLED having a normal organic light-emitting layer by a value obtained by multiplying an increase in the internal resistance of the organic light-emitting layer by the driving current Id. When the electric potential of the anode of the organic light-emitting diode OLED increases, the electric potential of the drain D of the driving transistor Td connected to the anode also increases. Accordingly, the potential difference Vds between the drain D and the source S of the driving transistor Td may decrease. The decreased potential difference Vds between the drain D and the source S of the driving transistor Td may reduce the driving current Id, and the luminance of the organic light-emitting diode OLED is thereby reduced. A reduction in the driving current Id due to the degradation of the organic light-emitting layer may be greater when the driving transistor Td operates in the transition region TR than when the driving transistor Td operates in the saturation region SR. Accordingly, a reduction in the luminance of the organic light-emitting diode OLED may also be greater in the transition region TR than in the saturation region SR.

The potential difference Vds between the drain D and the source S of the driving transistor Td may correspond to a first power supply voltage ELVDD and a second power supply voltage ELVSS. The first power supply voltage ELVDD may be higher than the second power supply voltage ELVSS. The first power supply voltage ELVDD may be applied to the source S of the driving transistor Td. The second power supply voltage ELVSS may be applied to the cathode of the organic light-emitting diode OLED. Therefore, the potential difference Vds between the drain D and the source S of the driving transistor Td may correspond to a voltage obtained by adding a threshold voltage of the organic light-emitting diode OLED to the first power supply voltage ELVDD and the second power supply voltage ELVSS. Hence, a difference between the first power supply voltage ELVDD and the second power supply voltage ELVSS may determine an operation region of the driving transistor Td, e.g., whether the driving transistor is in the saturation region SR or the transition region TR. In one exemplary embodiment, for example, the difference between the first power supply voltage ELVDD and the second power supply voltage ELVSS may be greater in the saturation region SR than in the transition region TR.

The pixel PX may further include a data control transistor T1, a capacitor C1, an initialization transistor T2, a threshold voltage compensation transistor T3, a first emission control transistor T4, and a second emission control transistor T5.

The data control transistor T1 may include a source provided with a corresponding data signal, e.g., a $j^{th}$ data signal Dj, a drain connected to the second node N2, and a gate provided with a corresponding scan signal, e.g., an $i^{th}$ scan signal Si. When the $i^{th}$ scan signal Si has an electric potential of a scan-on voltage, the data control transistor T1 may be turned on to provide the $j^{th}$ data signal Dj to the second node N2.

A first terminal of the capacitor C1 may be connected to the first node N1 which is connected to the gate G of the driving transistor Td, and the first power supply voltage ELVDD may be applied to a second terminal of the capacitor C1. Therefore, the capacitor C1 may store a voltage of the gate G of the driving transistor Td.

A previous scan signal of the corresponding scan signal, e.g., an $(i-1)^{th}$ scan signal Si-1, may be transmitted to a gate of the initialization transistor T2. When the $(i-1)^{th}$ scan signal Si-1 has the electric potential of the scan-on voltage, the initialization transistor T2 may be turned on to provide an initialization voltage VINT to the gate G of the driving transistor Td. As a result, an electric potential of the gate G of the driving transistor Td may be initialized.

The $i^{th}$ scan signal Si may be transmitted to a gate of the threshold voltage compensation transistor T3. When the $i^{th}$ scan signal Si has the electric potential of the scan-on voltage, the threshold voltage compensation transistor T3 may be turned on. The threshold voltage compensation transistor T3 may connect the gate G and the drain D of the driving transistor Td, thereby diode-connecting the driving transistor Td. When the driving transistor Td is diode-connected, a voltage, which dropped from a voltage of the $j^{th}$ data signal Dj transmitted to the source S of the driving transistor Td by a threshold voltage of the driving transistor Td, is applied to the gate G of the driving transistor Td, which is connected to the first terminal of the capacitor C1, such that the voltage applied to the gate G of the driving transistor Td may be maintained. In such an embodiment, where the voltage based on the threshold voltage of the driving transistor Td is applied to the gate G and maintained thereafter, an electric current flowing between the source S and the drain D of the driving transistor Td may not be affected by the threshold voltage of the driving transistor Td.

A corresponding emission control signal, e.g., an $i^{th}$ emission control signal Emi, may be transmitted to a gate electrode of the first emission control transistor T4. When the $i^{th}$ emission control signal EMi has an electric potential of an emission-on voltage, the first emission control transistor T4 may be turned on to provide the first power supply voltage ELVDD to the second node N2. The $i^{th}$ emission control signal EMi may be transmitted to a gate electrode of the second emission control transistor T5. When the $i^{th}$ emission control signal EMi has the electric potential of the emission-on voltage, the second emission control transistor T5 may be turned on to connect the third node N3 and the anode of the organic light-emitting diode OLED. When the $i^{th}$ emission control signal EMi has the electric potential of the emission-on voltage and the first emission control transistor T4 and the second emission control transistor T5 are turned on, the driving current Id corresponding to the voltage of the $j^{th}$ data signal Dj stored in the capacitor C1 is generated between the source S and the drain D of the driving transistor Td for a period of time during which the $i^{th}$ scan signal Si has the electric potential of the scan-on voltage. The driving current Id may flow to the organic light-emitting diode OLED, and the organic light-emitting diode OLED thereby emits light corresponding to the driving current Id.

Referring back to FIG. 2, the organic light-emitting display device 1 may further include a timing controller 20, the scan driver 30, the data driver 40, an emission driver 50 and a power supply 60. The timing controller 20 may receive image data R, G, B and generate a scan driver control signal SCS, a data driver control signal DCS, an emission driver control signal ECS and a power supply control signal VCS based on the image data R, G, B.

The scan driver 30 may receive the scan driver control signal SCS and generate the zeroth through $n^{th}$ scan signals S0 through Sn based on the scan driver control signal SCS. Each of the zeroth through $n^{th}$ scan signals S0 through Sn generated by the scan driver 30 may have an electric potential of a scan-on voltage or a scan-off voltage. The zeroth through $n^{th}$ scan signals S0 through Sn may sequentially have the electric potential of the scan-on voltage. A period during which the zeroth through $n^{th}$ scan signals S0 through Sn sequentially have the electric potential of the scan-on voltage may be the same as a period of a frame of an image displayed on the organic light-emitting display panel 10. In such an embodiment, each of the zeroth through $n^{th}$ scan signals S0 through Sn may sequentially have the scan-on voltage once every frame. In one exemplary embodiment, for example, the zeroth through $n^{th}$ scan signals S0 through Sn may sequentially have the electric potential of the scan-on voltage in the order of the zeroth scan signal S0 to the $n^{th}$ scan signal Sn. In an alternative exemplary embodiment, the zeroth through $n^{th}$ scan signals S0 through Sn may also have the electric potential of the scan-on voltage in the order of the $n^{th}$ scan signal Sn to the zeroth scan signal S0. When the first through $n^{th}$ scan signals S1 through Sn have the electric potential of the scan-on voltage, the first through $m^{th}$ data signals D1 through Dm may be transmitted to the pixels PX. The scan driver control signal SCS may include a vertical synchronization signal. The scan driver 30 may generate the zero$^{th}$ through $n^{th}$ scan signals S0 through Sn in synchronization with the vertical synchronization signal. In one exemplary embodiment, for example, the vertical synchronization signal may indicate a starting point from which the electric potential of the scan-on voltage may be applied sequentially to the zeroth through $n^{th}$ scan signals S0 through Sn within a frame of an image displayed on the organic light-emitting display panel 10.

The data driver 40 may generate the first through $m^{th}$ data signals D1 through Dm corresponding to the data driver control signal DCS. The data driver control signal DCS may include information about gray levels of an image to be displayed on the organic light-emitting display panel 10. Therefore, the first through $m^{th}$ data signals D1 through Dm may correspond to an image that is to be displayed on the organic light-emitting display panel 10. In such an embodiment, the first through $m^{th}$ data signals D1 through Dm may correspond to luminances of the pixels PX.

The emission driver 50 may receive the emission driver control signal ECS and generate first through $n^{th}$ emission signals EM1 through EMn in response to the emission driver control signal ECS. Each of the first through $n^{th}$ emission signals EM1 through EMn may have an electric potential of an emission-on voltage or an emission-off voltage. When the first through $n^{th}$ emission signals EM1 through EMn having the electric potential of the emission-on voltage is transmitted to organic light-emitting diodes included in the pixels PX, the organic light-emitting diodes may emit light. After the electric potential of the $i^{th}$ scan signal Si changes from the scan-on voltage to the scan-off voltage, the electric potential of an $i^{th}$ emission signal EMi may change from the emission-off voltage to the emission-on voltage.

The power supply 60 may provide the initialization voltage VINT, the first power supply voltage ELVDD and the second power supply voltage ELVSS to the organic light-emitting display panel 10 in response to the power supply control signal VCS.

Referring back to FIG. 1, in the providing of the voltages to the organic light-emitting display panel to operate the driving transistor in the transition region (operation S20), voltages provided to the organic light-emitting display panel 10 may be the first power supply voltage ELVDD and the second power supply voltage ELVSS. The first power supply voltage ELVDD and the second power supply voltage ELVSS may be provided from the power supply 60. The timing controller 20 may generate the power supply control signal VCS to generate the first power supply voltage ELVDD and the second power supply voltage ELVSS applied to the driving transistor Td for an operation thereof in the transition region TR. In an alternative exemplary embodiment, the first power supply voltage ELVDD and the second power supply voltage ELVSS may also be provided from outside the organic light-emitting display device 1. In an exemplary embodiment, a reduction in the luminance of the organic light-emitting diode OLED due to the degradation of the organic light-emitting layer included in the organic light-emitting diode OLED is greater when the driving transistor Td operates in the transition region TR than when the driving transistor Td operates in the saturation region SR. Therefore, a region in which the organic light-emitting diode OLED having the degraded organic light-emitting layer is located may be effectively identified when the driving transistor Td operates in the transition region TR.

In the determining of whether the organic light-emitting display device is defective (operation S30), whether the organic light-emitting display device 1 is defective may be determined based on an image displayed on the organic light-emitting display panel 10. The image data R, G, B input to the timing controller 20 in the determining of whether the organic light-emitting display device is defective (operation S30) may correspond to an image having substantially uniform luminance. In an exemplary embodiment, in which a defect in the organic light-emitting display device 1 is determined based the image data R, G, B corresponding to the image having the uniform luminance, the luminance of a pixel PX including an organic light-emitting diode OLED having a degraded organic light-emitting layer may be lower than the luminance of a pixel PX including a normal organic light-emitting diode OLED. Therefore, a defect in the organic light-emitting display device, e.g., a pixel PX which emits light at a luminance level lower than the luminance of the pixel PX including the normal organic light-emitting diode OLED may be effectively detected. The determining of whether the organic light-emitting display device is defective (operation S30) is performed in a state where the first power supply voltage ELVDD and the second power supply voltage ELVSS are applied to the organic light-emitting display panel 10 to operate the driving transistor Td in the transition region TR. Therefore, a pixel PX including an organic light-emitting diode OLED having a degraded organic light-emitting layer may be effectively and efficiently identified, and thus whether the organic light-emitting display device 1 is defective may be easily determined. In such an embodiment, a luminance difference between a normal pixel PX and a defective pixel PX whose luminance is reduced by the degradation of the organic light-emitting layer is displayed more noticeably or distinctively when the driving transistor Td operates in the transition region TR than in a normal state such that a defect in the organic light-emitting display device 1 may be defected in an early stage, e.g., before the degradation of the organic light-emitting diode due to impurities or outgassing develop over time.

Figure 5:
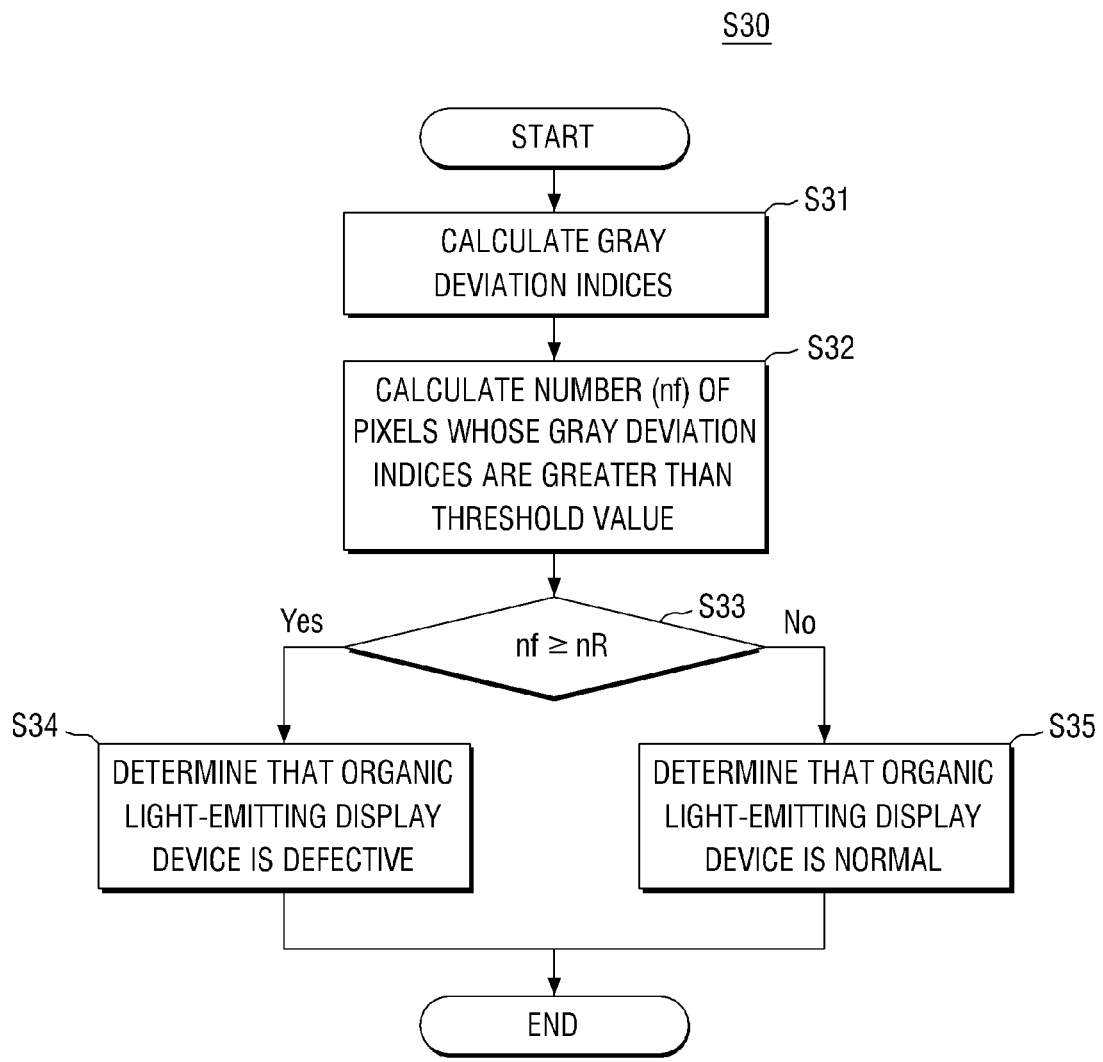
FIG. 5 is a flowchart illustrating an exemplary embodiment of an operation of determining whether an organic light-emitting display device is defective, according to the invention.

The determining of whether the organic light-emitting display device is defective (operation S30) will now be described in greater detail with reference to FIG. 5. FIG. 5 is a flowchart illustrating the determining of whether the organic light-emitting display device is defective (operation S30) in an exemplary embodiment of the method of detecting a defect in an organic light-emitting display device, according to the invention.

Referring to FIG. 5, the determining of whether the organic light-emitting display is defective (operation S30) may include calculating gray deviation indices (operation S31), calculating the number nf of pixels whose gray deviation indices are greater than a threshold value (operation 32), and determining that the organic light-emitting display device is defective when the number nf of the pixels whose gray deviation indices are greater than the threshold value is equal to or greater than a reference value nR (operations S33 and S34).

In the calculating of the gray deviation indices (operation S31), a gray deviation index is a value calculated for each of the pixels PX and is a numerical representation of differences between the luminance of each of the pixels PX and the luminances of surrounding pixels PX.

An exemplary embodiment of a method of calculating the gray deviation index will now be described in detail with reference to FIG. 6. FIG. 6 is a diagram illustrating gray values of a plurality of pixels of an exemplary embodiment of an organic light-emitting display device according to an embodiment of the invention.

Referring to FIG. 6, a gray deviation index of a first pixel PX1 may be the sum of differences between gray values of neighboring pixels, e.g., second through fifth pixels PX2 through PX5, and a gray value of the first pixel PX1. That is, the gray deviation index of the first pixel PX1 may be 77. The neighboring pixels, e.g., the second through fifth pixels PX2 through PX5 may be determined as pixels separated on both sides from the first pixel PX1 by x pixels in row and column directions of the pixels PX arranged substantially in a matrix form, where x is an integer. In one exemplary embodiment for example, x is one as shown in FIG. 6. However, the neighboring pixels are not limited to those shown in FIG. 6, and the value of x may vary according to setting. According to an alternative exemplary embodiment, a gray deviation index of a pixel PX may be calculated using the sum of differences between gray values of pixels PX separated on both sides from the pixel PX by x pixels only in the row direction and the gray value of the pixel PX or may be calculated using only the sum of differences between gray values of pixels PX separated on both sides from the pixel by x pixels only in the column direction and the gray value of the pixel PX.

Referring back to FIG. 5, in the calculating of the number nf of the pixels whose gray deviation indices are greater than the threshold value (operation 32), the gray deviation index of each of the pixels PX included in the organic light-emitting display panel 10 may be compared with the threshold value to calculate the number nf of pixels whose gray deviation indices are greater than the threshold value. The threshold value may be changed or variable by an external control. In such an embodiment, determining whether the gray deviation index of each of the pixels PX deviates from a normal range is performed based on the threshold value. In one exemplary embodiment, for example, a gray deviation index lower than the threshold value may be determined to be normal, and a gray deviation index higher than the threshold value may be determined to be abnormal. In FIG. 6, a degraded region Rf having a lower gray level than that of surrounding or neighboring region is identified in the organic light-emitting display panel 10. Gray deviation indices of pixels PX included in the degraded region Rf or located adjacent to the degraded region Rf may be higher than gray deviation indices of pixels PX located in the other region and may be higher than the threshold value.

In the determining that the organic light-emitting display device is defective when the number nf of the pixels whose gray deviation indices are greater than the threshold value is equal to or greater than the reference value nR (operations S33 and S34), it may be determined that the size of the degraded region Rf exceeds a size tolerance when the number nf of the pixels whose gray deviation indices are greater than the threshold value is equal to or greater than the reference value nR. Accordingly, it may be determined that the organic light-emitting display device 1 is defective.

The determining of whether the organic light-emitting display device is defective (operation S30) may further include determining that the organic light-emitting display device is normal when the number nf of the pixels whose gray deviation indices are greater than the threshold value is less than the reference value nR (operations S33 and S35). In the determining that the organic light-emitting display device is normal when the number nf of the pixels whose gray deviation indices are greater than the threshold value is less than the reference value nR (operations S33 and S35), it may be determined that the size of the degraded region Rf is within the tolerance size when the number of the pixels whose gray deviation indices are greater than the threshold value is less than the reference value nR. Accordingly, it may be determined that the organic light-emitting display device 1 is normal.

In an exemplary embodiment, calculating gray deviation indices and determining whether the organic light-emitting display device 1 is defective is performed based on the calculated gray deviation indices, as described above with reference to FIGS. 5 and 6. However, the method of determining whether the organic light-emitting display device 1 is defective is not limited thereto. According to an alternative exemplary embodiment, in the determining of whether the organic light-emitting display device is defective (operation S30), an inspector may judge the size of the degraded region Rf and the degree of reduction in the luminance of the degraded region Rf by inspecting an image displayed on the organic light-emitting display panel 10 with naked eyes and determine whether the organic light-emitting display device 1 is defective based on the size of the degraded region Rf and the degree of reduction in the luminance of the degraded region Rf.

Figure 7:
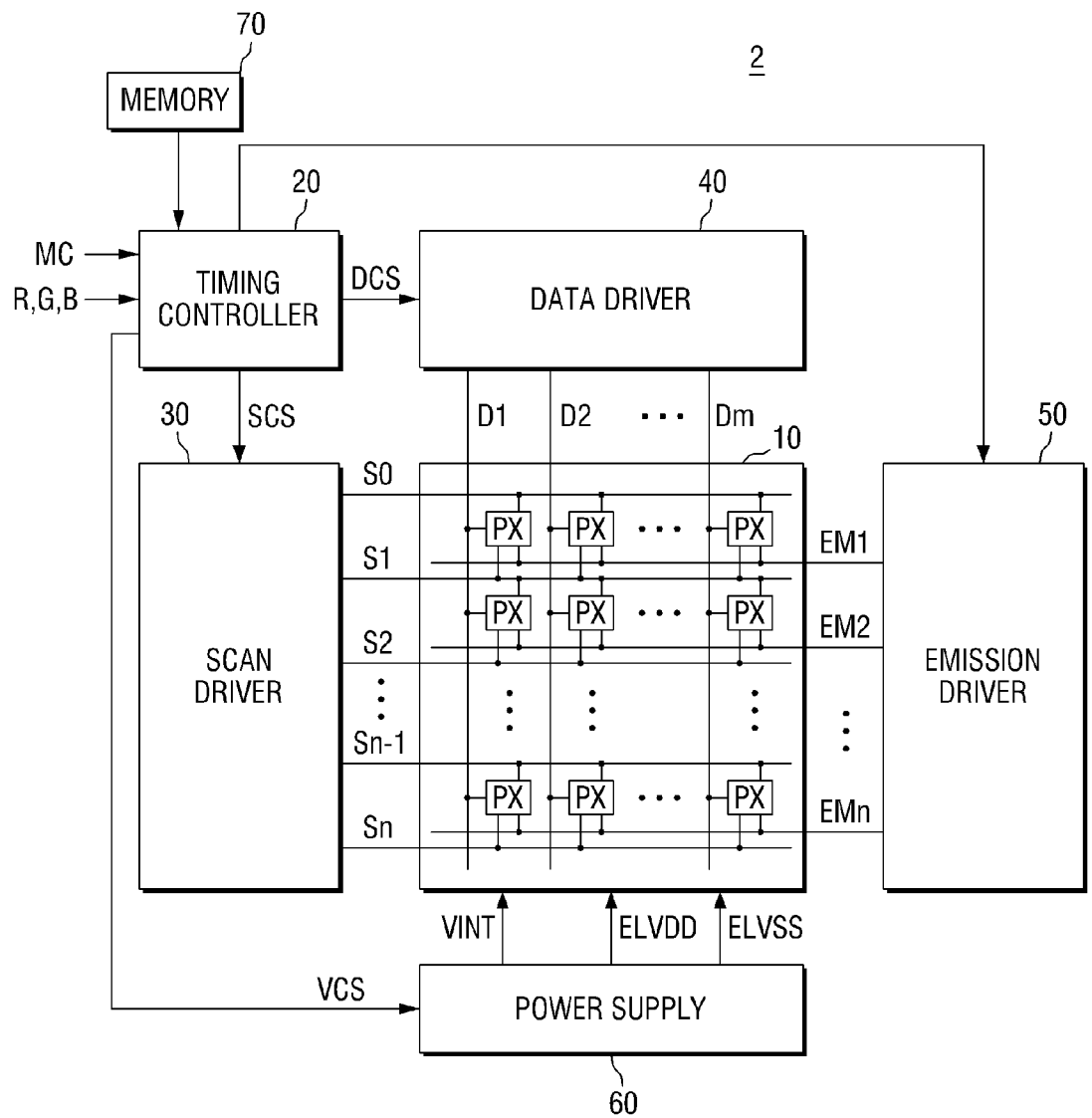
FIG. 7 is a block diagram showing an alternative exemplary embodiment of an organic light-emitting display device, according to the invention.
Figure 8:
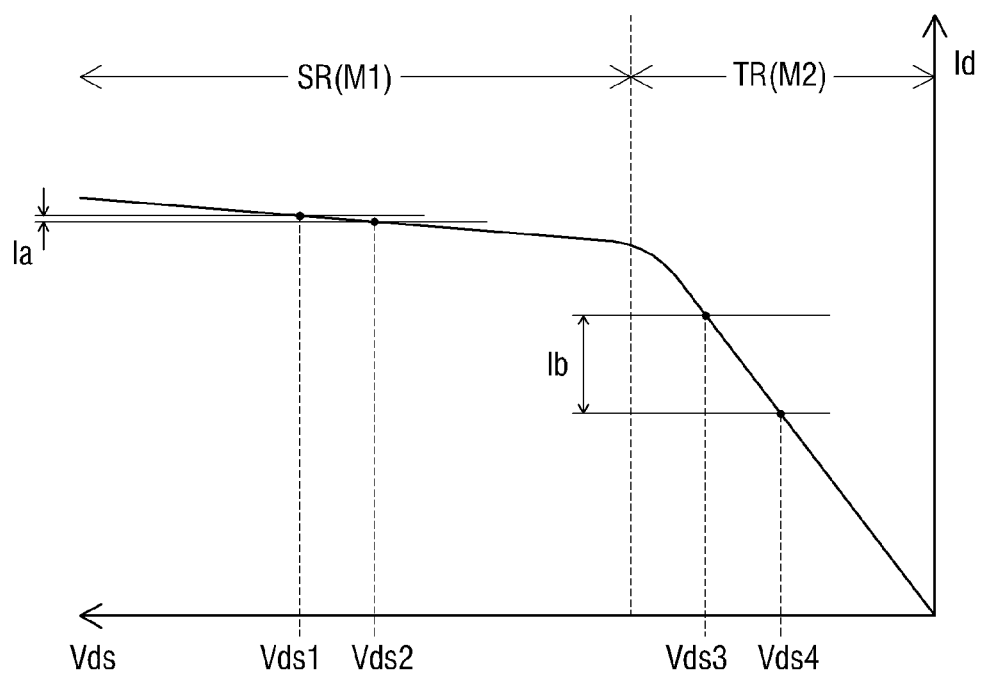
FIG. 8 is a graph illustrating the relationship between a potential difference between a drain and a source of a driving transistor and a driving current of an exemplary embodiment of an organic light-emitting display device, according to the invention.

Hereinafter, an alternative exemplary embodiment of an organic light-emitting display device, according to the invention, will be described with reference to FIGS. 7 and 8. FIG. 7 is a block diagram showing an alternative exemplary embodiment of an organic light-emitting display device 2 according to the invention. FIG. 8 is a graph illustrating the relationship between a potential difference between a drain and a source of a driving transistor and a driving current of an alternative exemplary embodiment of an organic light-emitting display device 2, according to the invention.

Referring to FIG. 7, an exemplary embodiment of the organic light-emitting display device 2 includes an organic light-emitting display panel 10 having a plurality of pixels PX.

The organic light-emitting display device 2 in FIG. 7 is substantially the same as the organic light-emitting display device 1 shown in FIG. 2 except for a memory 70. The same or like elements shown in FIG. 7 have been labeled with the same reference characters as used above to describe the exemplary embodiments of the organic light-emitting display device 1 shown in FIG. 2, and any repetitive detailed description thereof will hereinafter be omitted.

In an exemplary embodiment, as shown in FIGS. 7 and 8, the organic light-emitting display device 2 may operate in a normal mode M1 or a defect determination mode M2. The normal mode M1 may be a mode in which the organic light-emitting display device 2 displays an image. The defect determination mode M2 may be a mode in which a defect in the organic light-emitting display device 2 due to the degradation of an organic light-emitting layer is detected more effectively. Referring to FIG. 8, in the normal mode M1, a driving transistor Td may operate in a saturation region SR. In the defect determination mode M2, the driving transistor Td may operate in a transition region TR. In such an embodiment, a difference between a first power supply voltage ELVDD and a second power supply voltage ELVSS in the defect determination mode M2 may be less than a difference between the first power supply voltage ELVDD and the second power supply voltage ELVSS in the normal mode M1 such that the driving transistor Td is operated in the saturation region SR in the normal mode M1 and the driving transistor Td is operated in the transition region TR in the defect determination mode M2. According to one exemplary embodiment, for example, a level of the first power supply voltage ELVDD in the defect determination mode M2 may be equal to a level of the first power supply voltage ELVDD in the normal mode M1, and a level of the second power supply voltage ELVSS in the defect determination mode M2 may be higher than a level of the second power supply voltage ELVSS in the normal mode M1.

When the driving transistor Td operates in the transition region TR in the defect determination mode M2, a difference between the luminance of a region having a degraded organic light-emitting layer and the luminance of a normal region is more noticeable. Thus, a defect in the organic light-emitting display device 2 may be detected more effectively.

A timing controller 20 may receive a mode control signal MC. The timing controller 20 may control the organic light-emitting display device 2 to operate in the normal mode M1 or the defect determination mode M2 in response to the mode control signal MC.

In an exemplary embodiment, as shown in FIG. 7, the organic light-emitting display device 2 may further include a memory 70. In such an embodiment, data of an image displayed on the organic light-emitting display panel 10 in the defect determination mode M2 may be stored in the memory 70. When the organic light-emitting display device 2 operates in the defect determination mode M2, the timing controller 20 may control a scan driver 30 and a data driver 40 such that an image corresponding not to image data input from an external source but to image data stored in the memory 70 can be displayed on the organic light-emitting display panel 10. In such an embodiment, where the organic light-emitting display device 2 further includes the memory 70 which stores data of an image displayed on the organic light-emitting display panel 10 in the defect determination mode M2, a defect in the organic light-emitting display device 2 may be efficiently inspected without input of image data R, G, B from an external source. In an exemplary embodiment, respective gray values for the pixels PX may all be equal in the image data stored in the memory 70, such that a region with reduced luminance may be effectively detected.

According to exemplary embodiments of the invention set forth herein, a dark spot defect in an organic light-emitting display device is effectively detected in an early stage.

The invention should not be construed as being limited to the exemplary embodiments set forth herein. Rather, these exemplary embodiments are provided so that this disclosure will be thorough and complete and will fully convey the concept of the present invention to those skilled in the art.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A method of detecting a defect in an organic light-emitting display device, the method comprising:
    preparing the organic light-emitting display device comprising an organic light-emitting display panel which comprises a plurality of pixels,
    wherein each of the pixels comprises a driving transistor which operates in a saturation region or a transition region based on a potential difference between a source and a drain thereof and outputs a driving current, and an organic light-emitting diode which emits light based on the driving current;
    providing a plurality of voltages to the organic light-emitting display panel to operate the driving transistor in the transition region; and
    determining whether the organic light-emitting display device is defective based on an image, which is displayed on the organic light-emitting display panel based on data applied thereto,
    wherein a potential difference between the source and the drain when the driving transistor operates in the transition region is less than a potential difference between the source and the drain when the driving transistor operates in the saturation region,
    wherein the pixels are arranged substantially in a matrix form, and
    the determining of whether the organic light-emitting display device is defective comprises:
    calculating a gray deviation index of each of the pixels by adding differences between a gray value of the each of the pixels and gray values of neighboring pixels, which are separated on both sides from the each of the pixels by n pixels in row and column directions;
    detecting the number of pixels whose gray deviation indices are greater than a threshold value; and
    determining that the organic light-emitting display device is defective when the number of the pixels whose gray deviation indices are greater than the threshold value is equal to or greater than a reference value.

2. The method of claim 1, wherein the determining of whether the organic light-emitting display device is defective further comprises:
    determining that the organic light-emitting display device is normal when the number of the pixels whose gray deviation indices are greater than the threshold value is less than the reference value.

3. The method of claim 1, wherein the determining of whether the organic light-emitting display device is defective comprises determining whether the organic light-emitting display device is defective with a naked eye.

4. The method of claim 1, wherein the voltages comprise:
    a first power supply voltage; and
    a second power supply voltage having an electric potential lower than an electric potential of the first power supply voltage,
    wherein
    the first power supply voltage is applied to the source of the driving transistor, and
    the second power supply voltage is applied to a cathode of the organic light-emitting diode.

5. The method of claim 4, wherein each of the pixels further comprises:
    a first emission control transistor through which the first power supply voltage is applied to the source of the driving transistor; and
    a second emission control transistor which is connected between an anode of the organic light-emitting diode and the drain of the driving transistor.

6. The method of claim 1, wherein the organic light-emitting display device further comprises a voltage generator which generates the voltages.

7. The method of claim 1, wherein gray values corresponding to the pixels in the data applied to the organic light-emitting display panel to display the image are substantially equal to each other.

8. An organic light-emitting display device comprising:
    an organic light-emitting display panel comprising a plurality of pixels,
    wherein each of the pixels comprises:
    a driving transistor which operates in a saturation region or a transition region based on a potential difference between a source and a drain thereof and outputs a driving current;
    an organic light-emitting diode which emits light based on the driving current,
    wherein the organic light-emitting display panel operates in a normal mode or a defect determination mode, and
    a voltage generator which provides a first power supply voltage and a second power supply voltage lower than the first power supply voltage to the organic light-emitting display panel,
    wherein the driving transistor operates in the saturation region when the organic light-emitting display panel operates in the normal mode, and operates in the transition region when the organic light-emitting display panel operates in the defect determination mode,
    a level of the first power supply voltage when the organic light-emitting display panel operates in the defect determination mode is equal to a level of the first power supply voltage when the organic light-emitting display panel operates in the normal mode, and
    a level of the second power supply voltage when the organic light-emitting display panel operates in the defect determination mode is higher than a level of the second power supply voltage when the organic light-emitting display panel operates in the normal mode.

9. The display device of claim 8, wherein
    the potential difference between the source and the drain of the driving transistor is less when the driving transistor operates in the transition region than when the driving transistor operates in the saturation region.

10. The display device of claim 8, wherein the first power supply voltage is applied to the source of the driving transistor, and the second power supply voltage is applied to a cathode of the organic light-emitting diode.

11. The display device of claim 10, wherein each of the pixels further comprises:

a first thin-film transistor through which the first power supply voltage is applied to the source of the driving transistor; and a second thin-film transistor which is connected between an anode of the organic light-emitting diode and the drain of the driving transistor.

12. The display device of claim 10, wherein a difference between the first power supply voltage and the second power supply voltage is less in the defect determination mode than in the normal mode.

13. The display device of claim 12, wherein data, in which gray values for the pixels are substantially equal to each other, is applied to the organic light-emitting display panel when the organic light-emitting display panel operates in the defect determination mode.

14. The display device of claim 8, further comprising:

a memory which stores data of an image displayed on the organic light-emitting display panel in the defect determination mode.

* * * * *